United States Patent [19]

Ebihara et al.

[11] Patent Number: 5,323,065
[45] Date of Patent: Jun. 21, 1994

[54] SEMICONDUCTOR INTEGRATED CIRCUIT DEVICE HAVING EDGE TRIGGER FLIP-FLOP CIRCUIT FOR DECREASING DELAY TIME

[75] Inventors: Kou Ebihara; Kunihiko Kawaguchi, both of Kawasaki, Japan

[73] Assignee: Fujitsu Limited, Kawasaki, Japan

[21] Appl. No.: 924,941

[22] Filed: Aug. 5, 1992

[30] Foreign Application Priority Data

Aug. 8, 1991 [JP] Japan ................. 3-199458

[51] Int. Cl.[5] .................. H03K 3/289; H03K 5/12
[52] U.S. Cl. .................. 307/272.2; 307/445;
307/593; 307/595; 307/608; 307/263
[58] Field of Search .............. 307/272.1–272.2,
307/445, 593, 595, 608, 263

[56] References Cited

U.S. PATENT DOCUMENTS 5,097,149  3/1992  Lee ........................ 307/263
5,170,073  12/1992  Hahn et al. ................ 307/263

FOREIGN PATENT DOCUMENTS 57-68929  4/1982  Japan .
0134620  7/1985  Japan ........................ 307/272.1
0114112  5/1989  Japan ........................ 307/272.2

OTHER PUBLICATIONS

IBM Tech. Disc. Bul. "Post-indicating latch" Heilweil vol. 4, No. 7 Dec. 1961.

Primary Examiner—Margaret R. Wambach
Attorney, Agent, or Firm—Staas & Halsey

[57] ABSTRACT

A semiconductor integrated circuit device includes a preceding circuit portion, a flip-flop circuit portion receiving complementary output signals of the preceding circuit portion, for latching data in accordance with the complementary output signals of the preceding circuit portion, and a compensation circuit portion receiving complementary output signals of the flip-flop circuit portion and receiving the complementary output signals of the preceding circuit portion without passing through the flip-flop circuit portion, for compensating driving power and decreasing a delay time of a specific phase. Therefore, the delay time of the semiconductor integrated circuit device can be decreased in one phase (specific phase).

8 Claims, 5 Drawing Sheets 5,323,065

SEMICONDUCTOR INTEGRATED CIRCUIT DEVICE HAVING EDGE TRIGGER FLIP-FLOP CIRCUIT FOR DECREASING DELAY TIME

BACKGROUND OF THE INVENTION

1. Field of the Invention

The present invention relates to a semiconductor integrated circuit and more particularly, to a semiconductor integrated circuit device having an edge trigger type flip-flop circuit for decreasing delay time.

2. Description of the Related Art

Generally, in a large scale integration circuit such as a gate array circuit, and the like, an edge trigger type flip-flop circuit has been employed as a latch circuit, and the like. In the prior art, an edge trigger type flip-flop circuit (semiconductor integrated circuit device) having four three-inputs NAND gates and a latch circuit (flip-flop circuit) has been provided, for example, Japanese Unexamined Patent Publication No. 57-68929, to prevent a hazard on complementary output terminals when presetting the semiconductor integrated circuit device. Nevertheless, this edge trigger type flip-flop circuit of JPP'929 has a problem in that a load capacitance connected to an output of the flip-flop circuit influences the delay time of the other output (inverted output) of the flip-flop circuit. Note, this problem is important in a semiconductor integrated circuit device constituted by CMOS or Bi-CMOS circuits, as the CMOS and Bi-CMOS circuits do not have a large driving power.

Therefore, in recent years, an edge trigger type flip-flop (semiconductor integrated circuit device) having delay compensation gates connected to both outputs (complementary outputs) thereof has also been provided to compensate for the delay time. Namely, the semiconductor integrated circuit device (edge trigger type flip-flop circuit) comprises a preceding circuit portion, a flip-flop circuit portion, and a compensation circuit portion. The compensation circuit portion includes two inverters to thereby decrease the difference between the delay times caused by different values of load capacitance at the output and inverted output of the flip-flop circuit portion. Nevertheless, in the edge trigger type flip-flop having the delay compensation circuit portion, the delay time becomes long and the operation speed becomes slow. Note, in semiconductor integrated circuit devices, high speed operation, in accordance with the development of semiconductor device technology, has been also required.

SUMMARY OF THE INVENTION

An object of the present invention is to provide a semiconductor integrated circuit device having an edge trigger type flip-flop circuit to decrease a delay time thereof (delay time of a specific phase).

According to the present invention, there is provided a semiconductor integrated circuit device comprising a preceding circuit portion, a flip-flop circuit portion receiving the complementary output signals of the preceding circuit portion, for latching data in accordance with the complementary output signals of the preceding circuit portion, a compensation circuit portion receiving complementary output signals of the flip-flop circuit portion and the complementary output signals of the preceding circuit portion without passing through the flip-flop circuit portion, for compensating driving power and decreasing a delay time of a specific phase.

The preceding circuit portion may comprise first, second, third, and fourth three-inputs NAND gates supplied with a preset signal, clock signal, data signal, and clear signal, and the preceding circuit portion may be used to prevent a hazard event on complementary output terminals thereof, when presetting the preceding circuit portion. The preset signal may be supplied to the first and third NAND gates; the clock signal may be supplied to the second and third NAND gates; the data signal may be supplied to the fourth NAND gate; the clear signal may be supplied to the second and fourth NAND gates; an output signal of the first NAND gate may be supplied to the second NAND gate; an output signal of the second NAND gate may be supplied to the first and third NAND gates; an output signal of the third NAND gate may be supplied to the fourth NAND gate; and an output signal of the fourth NAND gate may be supplied to the first and third NAND gates, respectively.

The preceding circuit portion may comprise first, second and third three-inputs NAND gates, first and second four-inputs AND gates, a two-inputs NOR gate, and an inverter, supplied with a preset signal, clock signal, first and second data signals, enable signal, and clear signal, and the preceding circuit portion may be used to prevent a hazard event on complementary output terminals thereof, when presetting the preceding circuit portion. The preset signal may be supplied to the first and third NAND gates; the clock signal may be supplied to the second and third NAND gates; the first data signal may be supplied to the first AND gate; the second data signal may be supplied to the second AND gate; the clear signal may be supplied to the second NAND gate and the first and second AND gates; an output signal of the first NAND gate may be supplied to the second NAND gate; an output signal of the second NAND gate may be supplied to the first and third NAND gates; an output signal of the third NAND gate may be supplied to the first and second AND gates; output signals of the first and second AND gate may be supplied to the NOR gate; and an output signal of the NOR gate may be supplied to the first and third NAND gates, respectively.

The flip-flop circuit portion may include fifth and sixth three-inputs NAND gates supplied with a preset signal and clear signal. The preset signal may be supplied to the fifth NAND gate; the clear signal may be supplied to the sixth NAND gate; one output signal of the complementary output signals of the preceding circuit portion may be supplied to the fifth NAND gate; the other output signal of the complementary output signals of the preceding circuit portion may be supplied to the sixth NAND gate; an output signal of the fifth NAND gate may be supplied to the sixth NAND gate; and an output signal of the sixth NAND gate may be supplied to the fifth NAND gate.

The compensation circuit portion may comprise seventh and eighth two-inputs NAND gates. One output signal of the complementary output signals of the preceding circuit portion may be supplied to a first input terminal of the eighth NAND gate without passing through the flip-flop circuit portion; the other output signal of the complementary output signals of the preceding circuit portion may be supplied to a first input terminal of the seventh NAND gate without passing through the flip-flop circuit portion; one output signal of the complementary output signals of the flip-flop circuit portion may be supplied to a second input terminal of the seventh NAND gate; and the other output signal of the complementary output signals of the flip-flop circuit portion may be supplied to a second input terminal of the eighth NAND gate.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, the problems of the related art will be explained, with reference to FIGS. 1 and 2.

Figure 1:
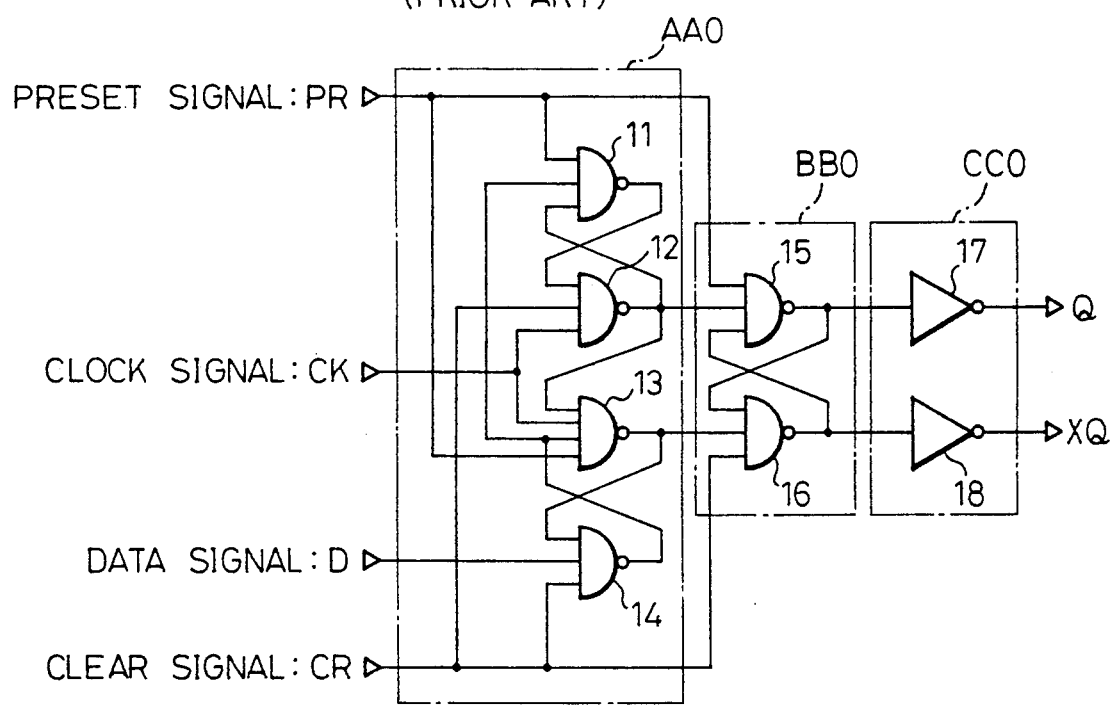
FIG. 1 is a circuit diagram showing an example of a semiconductor integrated circuit device having an edge trigger type flip-flop circuit, according to the prior art.

FIG. 1 shows an example of a semiconductor integrated circuit device having an edge trigger type flip-flop circuit, according to the prior art.

As shown in FIG. 1, the semiconductor integrated circuit device (edge trigger type flip-flop circuit) comprises a preceding circuit portion AA0, a flip-flop circuit portion BB0, and a compensation circuit portion CC0. The preceding circuit portion AA0 includes four three-inputs NAND gates 11–14 supplied with a preset signal PR, clock signal CK, data signal D, and clear signal CR. The flip-flop circuit portion BB0 includes two three-inputs NAND gates 15 and 16, and the compensation circuit portion CC0 includes two inverters 17 and 18. Note, the load capacitance connected to the output and inverted output of the flip-flop circuit portion BB0 are different, and the delay times of the output and inverted output (complementary output signals) of the flip-flop circuit portion BB0 are also different. Therefore, the inverters 17 and 18 are used to increase driving powers and decrease the difference between the delay times of the output and inverted output of the flip-flop circuit portion BB0.

Namely, in the preceding circuit portion AA0, as shown in FIG. 1, the preset signal PR is supplied to the gates 11 and 13; the clock signal CK is supplied to the gates 12 and 13; the data signal D is supplied to the gate 14, and the clear signal CR is supplied to the gates 12 and 14. An output signal of the gate 11 is supplied to the gate 12; an output signal of the gate 12 is supplied to the gates 11 and 13; an output signal of the gate 13 is supplied to the gate 14; and an output signal of the gate 14 is supplied to the gates 11 and 13, respectively. Note, this preceding circuit portion AA0 is used to prevent a hazard event on complementary output terminals (which correspond to the output signals of the gates 12 and 13), when presetting the preceding circuit portion AA0 (with reference to Japanese Unexamined Patent Publication No. 57-68929).

In the flip-flop circuit portion BB0, the preset signal PR is supplied to the gate 15; the clear signal CR is supplied to the gate 16; the output signal of the gate 12 (corresponding to one output signal of the complementary output signals of the preceding circuit portion AA0) is supplied to the gate 15; and the output signal of the gate 13 (corresponding to the other output signal (inverted output signal) of the complementary output signals of the preceding circuit portion AA0) is supplied to the gate 16. An output signal of the gate 15 is supplied to the gate 16, and an output signal of the gate 16 is supplied to the gate 15. Further, the output signal of the gate 15 (corresponding to one output signal of the complementary output signals of the flip-flop circuit portion BB0) is output through the inverter 17 of the compensation circuit portion CC0 as an output signal Q, and the output signal of the gate 16 (corresponding to the other output signal (inverted output signal) of the complementary output signals of the flip-flop circuit portion BB0) is output through the inverter 18 of the compensation circuit portion CC0 as an inverted output signal XQ. Note, as described above, the inverters 17 and 18 are used to decrease the difference between the delay times caused by different of load capacitance values at the output and inverted output of the flip-flop circuit portion BB0 (semiconductor integrated circuit device).

In the above descriptions, data signal D is latched in the flip-flop portion BB0 in accordance with an edge of a clock signal CK, and an output Q and inverted output XQ (complementary output signals of the semiconductor integrated circuit device) are output from the compensation circuit portion CC0. Note, the preset signal PR is used to preset the output signals Q and XQ of the semiconductor integrated circuit device (edge trigger type flip-flop circuit), and the clear signal CR is used to clear the output signals Q and XQ thereof. Namely, when the preset signal PR is changed to a low level "L", the output signals of the gates 11, 13, 15 are brought to high levels "H", and thus the output signal Q is determined at a low level "L" and the inverted output signal XQ is determined at a high level "H". On the other hand, when the clear signal CR is changed to a low level "L", the output signals of the gates 12, 14, 15 are brought to high levels "H", and thus the output signal Q is determined at a high level "H" and the inverted output signal XQ is determined at a low level "L".

Figure 2A:
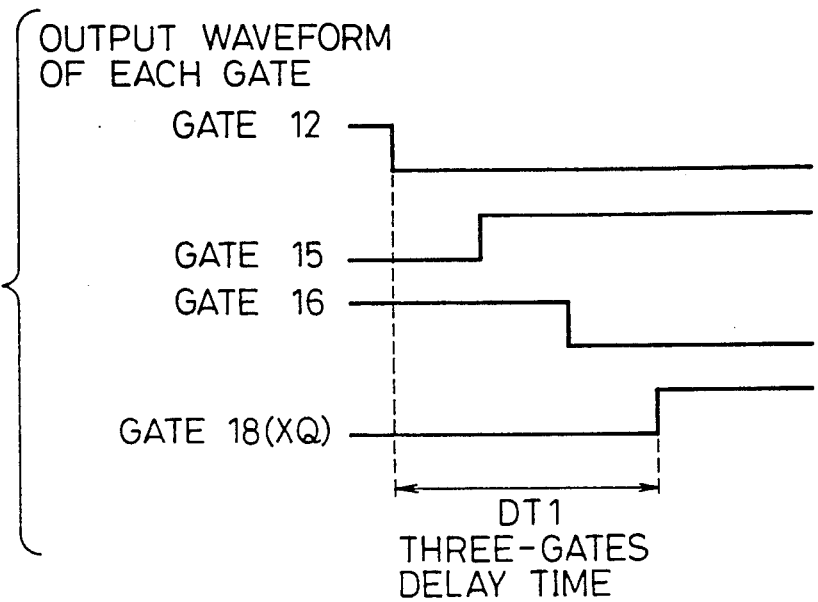
FIGS. 2A and 2B are diagrams showing output waveforms of gates employed in the semiconductor integrated circuit device as shown in FIG. 1.
Figure 2B:
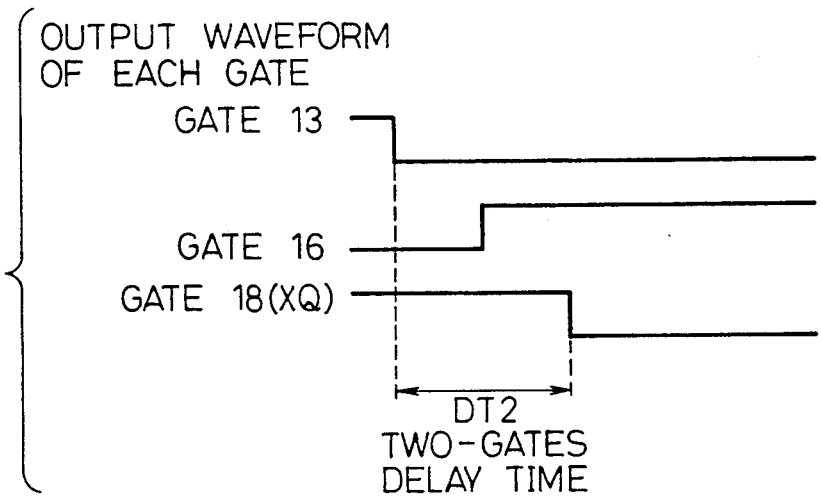

FIGS. 2A and 2B are diagrams showing output waveforms of gates employed in the semiconductor integrated circuit device as shown in FIG. 1.

First, as shown in FIG. 2A, when an output signal of the gate 12 falls from a high level "H" to a low level "L", an output signal of the gate 15 changes from a low level "L" to a high level "H" after a delay time of the gate 15, and then an output signal of the gate 16 changes from a high level "H" to a low level "L" after a delay time of the gate 16. Further, when an output signal of the gate 16 falls from the high level "H" to the low level "L", an output signal of the inverter 18 (inverted output signal XQ of the semiconductor integrated circuit device) changes from a low level "L" to a high level "H" after a delay time of the inverter 18.

Therefore, when an output signal of the gate 12 falls from a high level "H" to a low level "L", the output signal XQ is output after a delay time DT1. Note, the delay time DT1 is determined by adding the delay times of the gates 15, 16 and the inverter (gate) 18, i.e., three-gates delay time of the gates 15, 16 and 18.

Similarly, with regard to an output signal of the inverter 17 (output signal Q of the semiconductor integrated circuit device), when an output signal of the gate 13 falls from a high level "H" to a low level "L", the output signal Q is output after a delay time DT1. The delay time DT1 is determined by adding the delay times of the gates 16, 15 and the inverter (gate) 17, i.e., three-gates delay time of the gates 16, 15 and 17. Note, when an output signal of the gate 13 falls from a high level "H" to a low level "L", the waveform of each of the gates 13, 16, 15 and 17 is the same as that of the gates 12, 15, 16 and 18 shown in FIG. 2A when an output signal of the gate 12 falls from a high level "H" to a low level "L".

Next, as shown in FIG. 2B, when an output signal of the gate 13 falls from a high level "H" to a low level "L", an output signal of the gate 16 changes from a low level "L" to a high level "H" after a delay time of the gate 16, and then an output signal of the inverter 18 (inverted output signal XQ) changes from a high level "H" to a low level "L" after a delay time of the inverter 18.

Therefore, when an output signal of the gate 13 falls from a high level "H" to a low level "L", an output signal XQ is output after a delay time DT2. Note, the delay time DT2 is determined by adding the delay times of the gate 16 and the inverter (gate) 18, i.e., two-gates delay time of the gates 16 and 18.

Similarly, with regard to an output signal of the inverter 17 (output signal Q), when an output signal of the gate 12 falls from a high level "H" to a low level "L", the output signal Q is output after a delay time DT2. The delay time DT2 is determined by adding the delay times of the gate 15 and the inverter (gate) 17, i.e., two-gates delay time of the gates 15 and 17. Note, when an output signal of the gate 12 falls from a high level "H" to a low level "L", the waveform of each of the gates 12, 15 and 17 is the same as that of the gates 13, 16 and 18 shown in FIG. 2B when an output signal of the gate 13 falls from a high level "H" to a low level "L".

Below, the preferred embodiments of a semiconductor integrated circuit device having an edge trigger type flip-flop circuit, according to the present invention, will be explained with reference to FIGS. 3 to 5.

Figure 3:
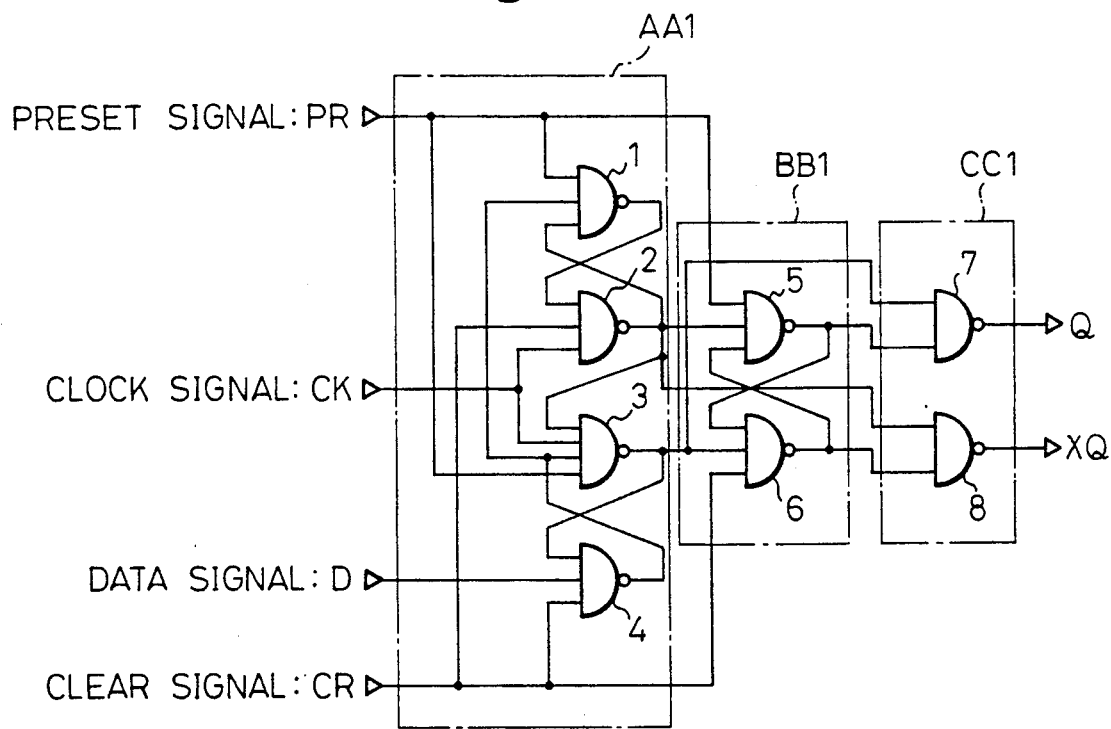
FIG. 3 is a circuit diagram showing an embodiment of a semiconductor integrated circuit device having an edge trigger type flip-flop circuit, according to the present invention.

FIG. 3 shows an embodiment of a semiconductor integrated circuit device having an edge trigger type flip-flop circuit, according to the present invention.

As shown in FIG. 3, the semiconductor integrated circuit device (edge trigger type flip-flop circuit) comprises a preceding circuit portion AA1, a flip-flop circuit portion BB1, and a compensation circuit portion CC1. The preceding circuit portion AA1 includes four three-inputs NAND gates 1-4 supplied with a preset signal PR, clock signal CK, data signal D, and clear signal CR. The flip-flop circuit portion BB1 includes two three-inputs NAND gates 5 and 6, and the compensation circuit portion CC1 includes two two-inputs NAND gates 7 and 8. Note, the configuration of the preceding circuit portion AA1 and flip-flop circuit portion BB1 are the same as that of the preceding circuit portion AA0 and flip-flop circuit portion BB0 shown in FIG. 1.

Namely, in the preceding circuit portion AA1, as shown in FIG. 3, the preset signal PR is supplied to the gates 1 and 3; the clock signal CK is supplied to the gates 2 and 3; the data signal D is supplied to the gate 4; and the clear signal CR is supplied to the gates 2 and 4. An output signal of the gate 1 is supplied to the gate 2; an output signal of the gate 2 is supplied to the gates 1 and 3; an output signal of the gate 3 is supplied to the gate 4; and an output signal of the gate 4 is supplied to the gates 1 and 3, respectively. Note, this preceding circuit portion AA1, which is the same configuration as the preceding circuit portion AA0 shown in FIG. 1, is used to prevent a hazard event on complementary output terminals (which correspond to the output signals of the gates 2 and 3, or complementary output signals of the preceding circuit portion AA1), when presetting the preceding circuit portion AA1.

In the flip-flop circuit portion BB1, the preset signal PR is supplied to the gate 5; the clear signal CR is supplied to the gate 6; the output signal of the gate 2 is supplied to the gate 5; and the output signal of the gate 3 is supplied to the gate 6. An output signal of the gate 5 is supplied to the gate 6, and an output signal of the gate 6 is supplied to the gate 5.

In the compensation circuit portion CC1, as shown in FIG. 3, the output signal of the gate 2 (corresponding to one output signal of the complementary output signals of the preceding circuit portion AA1) is supplied to a first input terminal of the NAND gate 8 without passing through the flip-flop circuit portion BB1, and the output signal of the gate 6 (corresponding to the other output signal (inverted output signal) of the complementary output signals of the flip-flop circuit portion BB1) is supplied to a second input terminal of the NAND gate 8. An output signal of the NAND gate 8 is output as an inverted output signal XQ of the semiconductor integrated circuit device.

Similarly, the output signal of the gate 3 (corresponding to the other output signal (inverted output signal) of the complementary output signals of the preceding circuit portion AA1) is supplied to a first input terminal of the NAND gate 7 without passing through the flip-flop circuit portion BB1, and the output signal of the gate 5 (corresponding to one output signal of the complementary output signals of the flip-flop circuit portion BB1) is supplied to a second input terminal of the NAND gate 7. An output signal of the NAND gate 7 is output as an output signal Q of the semiconductor integrated circuit device.

Note, in the compensation circuit portion CC1, the NAND gates 7 and 8 are used to decrease the difference between the delay times caused by different values of load capacitance at the output and inverted output of the flip-flop circuit portion BB1 (semiconductor integrated circuit device).

In the above descriptions, data signal D is latched in the flip-flop portion BB1 in accordance with an edge of a clock signal CK, and an output Q and inverted output XQ (complementary output signals of the semiconductor integrated circuit device) are output from the compensation circuit portion CC1. Note, the preset signal PR is used to preset the output signals Q and XQ of the semiconductor integrated circuit device (edge trigger type flip-flop circuit), and the clear signal CR is used to clear the output signals Q and XQ thereof. Namely, when the preset signal PR is changed to a low level "L", the output signals of the gates 1, 3, 5 are brought to high levels "H", and thus the output signal Q is determined at a low level "L" and the inverted output signal XQ is determined at a high level "H". On the other hand, when the clear signal CR is changed to a low level "L", the output signals of the gates 2, 4, 5 are brought to high levels "H", and thus the output signal Q is determined at a high level "H" and the inverted output signal XQ is determined at a low level "L".

Figure 4A:
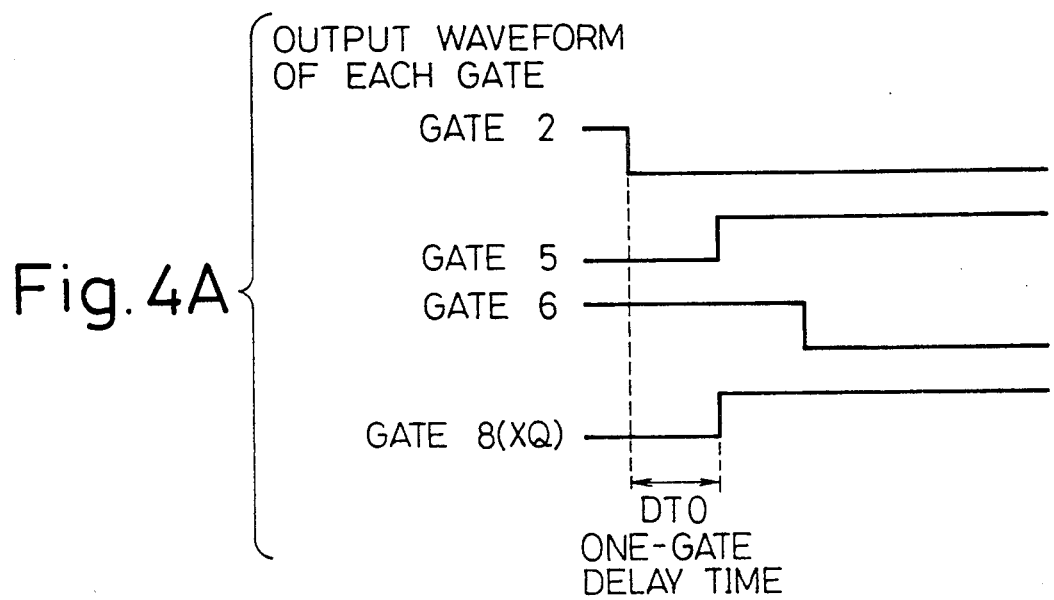
FIGS. 4A and 4B are diagrams showing output waveforms of gates employed in the semiconductor integrated circuit device as shown in FIG. 3.
Figure 4B:
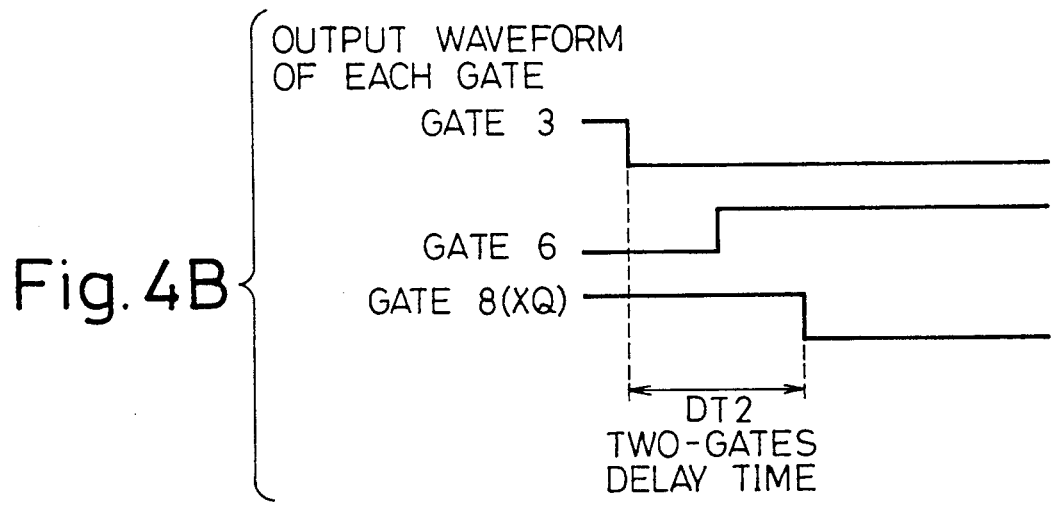

FIGS. 4A and 4B are diagrams showing output waveforms of gates employed in the semiconductor integrated circuit device as shown in FIG. 3.

First, as shown in FIG. 4A, when an output signal of the gate 2 falls from a high level "H" to a low level "L", an output signal of the gate 5 changes from a low level "L" to a high level "H" after a delay time of the gate 5, and then an output signal of the gate 6 changes from a high level "H" to a low level "L" after a delay time of the gate 6. Further, when an output signal of the gate 6 falls from a high level "H" to a low level "L", an output signal of the NAND gate 8 (inverted output signal XQ of the semiconductor integrated circuit device) changes from a low level "L" to a high level "H" by a one-gate delay time of the gate 8.

Note, when an output signal of the gate 2 falls from a high level "H" to a low level "L", a second input terminal of the gate 8 (to which the output signal of the gate 6 is supplied) is changed from a high level "H" to a low level "L" after a two-gates delay time corresponding to the sum of the delay times of the gates 5 and 6. Nevertheless, when the output signal of the gate 2 falls from a high level "H" to a low level "L", a first input terminal of the gate 8 is changed from a high level "H" to a low level "L" without delaying, as the output signal of the gate 2 is directly supplied to the first input terminal of the gate 8. Therefore, the output signal of the gate 2 falls from a high level "H" to a low level "L", an output signal of the NAND gate 8 (inverted output signal XQ of the semiconductor integrated circuit device) is changed after a delay time DT0 determined by a delay time of the NAND gate 8, and because at least one input signal (input terminal) of the NAND gate 8 falls from a high level "H" to a low level "L", an output signal (inverted output signal XQ) of the NAND gate 8 is changed from a high level "H" to a low level "L".

Therefore, when an output signal of the gate 2 falls from a high level "H" to a low level "L", an output signal XQ is output after a delay time DT0. Note, the delay time DT0 is determined by only one gate 8, i.e., one-gate delay time of the NAND gate 8.

Similarly, with regard to an output signal of the NAND gate 7 (output signal Q of the semiconductor integrated circuit device), when an output signal of the gate 3 falls from a high level "H" to a low level "L", the output signal Q is output after a delay time DT0. The delay time DT0 is determined by only one gate 7, i.e., one-gate delay time of the NAND gate 7. Note, when an output signal of the gate 3 falls from a high level "H" to a low level "L", the waveform of each of the gates 3, 6, 5 and 7 is the same as that of the gates 2, 5, 6 and 8 shown in FIG. 4A when an output signal of the gate 2 falls from a high level "H" to a low level "L".

On the other hand, with comparing the waveforms shown in FIGS. 2B and 4B, when an output signal of the gate 3 falls from a high level "H" to a low level "L", an output signal XQ is output after a delay time DT2, which is the same as that in the prior art semiconductor integrated circuit device shown in FIG. 1. Namely, as shown in FIG. 4B, when an output signal of the gate 3 falls from a high level "H" to a low level "L", an output signal of the gate 6 changes from a low level "L" to a high level "H" after a delay time of the gate 6, and then an output signal of the inverter 8 (inverted output signal XQ) changes from a high level "H" to a low level "L" after a delay time of the inverter 8.

Therefore, when an output signal of the gate 3 falls from a high level "H" to a low level "L", an output signal XQ is output after a delay time DT2. Note, the delay time DT2 is determined by adding the delay times of the gate 6 and the inverter (gate) 8, i.e., two-gates delay time of the gates 6 and 8.

Similarly, with regard to an output signal of the NAND gate 7 (output signal Q), when an output signal of the gate 2 falls from a high level "H" to a low level "L", the output signal Q is output after a delay time DT2. The delay time DT2 is determined by adding the delay times of the gate 5 and the NAND gate (gate) 7, i.e., two-gates delay time of the gates 5 and 7. Note, when an output signal of the gate 2 falls from a high level "H" to a low level "L", the waveform of each of the gates 2, 5 and 7 is the same as that of the gates 3, and 8 shown in FIG. 4B when an output signal of the gate 3 falls from a high level "H" to a low level "L".

Consequently, according to the semiconductor integrated circuit device of the present embodiment, in one phase (specific phase: with regard to the output signal XQ (Q), when an output signal of the gate 2 (3) falls from a high level "H" to a low level "L"), the delay time DT0 of the semiconductor integrated circuit device is determined to be a one-gate delay time. Note, in the other phase (with regard to the output signal XQ (Q), when an output signal of the gate 3 (2) falls from a high level "H" to a low level "L", or when an output signal of the gate 2 (3) rises from a low level "L" to a high level "H"), the delay time DT2 of the semiconductor integrated circuit device is determined to be a two-gates delay time, which is the same delay time of the prior art device.

Figure 5:
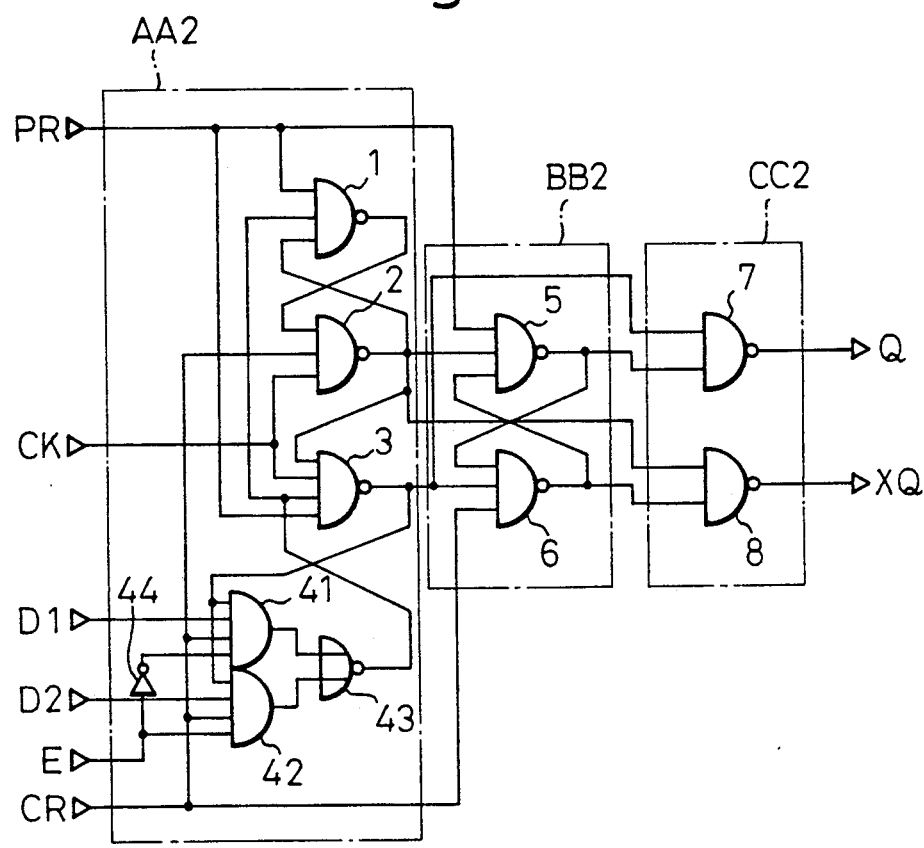
FIG. 5 is a circuit diagram showing a modified embodiment of the semiconductor integrated circuit device shown in FIG. 3.

FIG. 5 shows a modified embodiment of the semiconductor integrated circuit device shown in FIG. 3.

In FIG. 5, reference AA2 denotes a preceding circuit portion AA1, BB2 denotes a flip-flop circuit portion, and CC2 denotes a compensation circuit portion. Further, reference PR denotes a preset signal, CK notes a clock signal, D1 and D2 denote data signals, E denotes an enable signal, and CR denotes a clear signal CR. Note, the flip-flop circuit portion BB2 and compensation circuit portion CC2 are the same configurations as the flip-flop circuit portion BB1 and compensation circuit portion CC1 shown in FIG. 3. Further, in the preceding circuit portion AA2, three three-inputs NAND gates 1-3 also have the same configurations as shown in FIG. 3.

Therefore, explanations of the flip-flop circuit portion BB2 and compensation circuit portion CC2 are omitted in this modified embodiment.

As shown in FIG. 5, the preceding circuit portion AA2 comprises three three-inputs NAND gates 1-3, two four-inputs AND gates 41 and 42, two-inputs NOR gate 43, and an inverter 44. In the preceding circuit portion AA2, the preset signal PR is supplied to the gates 1 and 3; the clock signal CK is supplied to the gates 2 and 3; the data signal D1 is supplied to the gate 41; and the data signal D2 is supplied to the gate 42. Further, the enable signal E is supplied to the gate 42 and also supplied to the gate 41 through the inverter 44, and the clear signal CR is supplied to the gates 2, 41 and 42. An output signal of the gate 1 is supplied to the gate 2; an output signal of the gate 2 is supplied to the gates 1 and 3; an output signal of the gate 3 is supplied to the gates 41 and 42; and an output signal of the gate 43 is supplied to the gates 1 and 3, respectively. Note, output signals of the gates 41 and 42 are supplied to the gate 43. Further, this preceding circuit portion AA2 is used to prevent a hazard event on complementary output terminals (which correspond to the output signals of the gates 2 and 3), when presetting the preceding circuit portion AA2. The enable signal E is used to select one gate of the AND gates 41 and 42.

In this modified embodiment, with regard to an output signal XQ, when an output signal of the gate 2 falls from a high level "H" to a low level "L", the output signal XQ is output after a delay time DT0. Note, the delay time DT0 is determined by only one gate 8, i.e., one-gate delay time of the NAND gate 8.

Similarly, with regard to an output signal Q, when an output signal of the gate 3 falls from a high level "H" to a low level "L", the output signal Q is output after a delay time DT0. Note, the delay time DT0 is determined by only one gate 7, i.e., one-gate delay time of the NAND gate 7.

Consequently, according to the semiconductor integrated circuit device of the present modified embodiment, in one phase, the delay time DT0 of the semiconductor integrated circuit device is determined to be a one-gate delay time. Note, in the other phase, the delay time DT2 of the semiconductor integrated circuit device is determined to be a two-gates delay time, which is the same delay time of the prior art device.

As described above, in accordance with the semiconductor integrated circuit device of the present invention, the delay time of the semiconductor integrated circuit device can be decreased in one phase, but the delay time of the other phase cannot be decreased in the other phase, or the delay time of the other phase is the same as that of the prior art device shown in FIG. 1. Nevertheless, a circuit designer or user can use one of the complementary signals (output signals Q and XQ), and when the delay time of the semiconductor integrated circuit device (edge trigger type flip-flop circuit) can be decreased in only one phase (specific phase), the delay time of a total semiconductor integrated circuit device can be decreased. Further, the present invention can be applied to various semiconductor integrated circuit devices having an edge trigger type flip-flop circuit, and these semiconductor integrated circuit devices can be constituted by CMOS integrated circuits, bipolar integrated circuits, or Bi-CMOS integrated circuits.

Many widely differing embodiments of the present invention may be constructed without departing from the spirit and scope of the present invention, and it should be understood that the present invention is not limited to the specific embodiments described in this specification, except as defined in the appended claims.

We claim:

1. A semiconductor integrated circuit device comprising:
    a preceding circuit portion outputting complementary output signals of said preceding circuit portion;
    a flip-flop circuit portion receiving the complementary output signals of said preceding circuit portion, for outputting complementary output signals of said flip-flop circuit portion by latching data in accordance with the complementary output signals of said preceding circuit portion wherein said flip-flop circuit portion includes first and second three-inputs NAND gates supplied with a present signal and a clear signal;
    a compensation circuit portion receiving the complementary output signals of said flip-flop circuit portion and receiving the complementary output signals of said preceding circuit portion without passing through said flip-flop circuit portion, for compensating driving power and decreasing a delay time of a specific phase.

2. A semiconductor integrated circuit device as claimed in claim 1, wherein said preceding circuit portion comprises third, fourth, fifth, and sixth three-inputs NAND gates supplied with a preset signal, clock signal, data signal, and clear signal, and said preceding circuit portion is used to prevent a hazard event on complementary output terminals thereof, when presetting said preceding circuit portion.

3. A semiconductor integrated circuit device as claimed in claim 2, wherein the preset signal is supplied to said third and fifth NAND gates, the clock signal is supplied to said fourth and fifth NAND gates, the data signal is supplied to said sixth NAND gate, the clear signal is supplied to said fourth and sixth NAND gates, an output signal of said third NAND gate is supplied to said fourth NAND gate, an output signal of said fourth NAND gate is supplied to said third and fifth NAND gates, an output signal of said fifth NAND gate is supplied to said sixth NAND gate, and an output signal of said sixth NAND gate is supplied to said third and fifth NAND gates, respectively.

4. A semiconductor integrated circuit device as claimed in claim 1, wherein said preceding circuit portion comprises third, fourth and sixth three-inputs NAND gate, first and second four-inputs AND gates, a two-inputs NOR gate, and an inverter, supplied with a preset signal, clock signal, first and second data signals, enable signal, and clear signal, and said preceding circuit portion is used to prevent a hazard event on complementary output terminals thereof, when presetting said preceding circuit portion.

5. A semiconductor integrated circuit device as claimed in claim 4, wherein the preset signal is supplied to said third and fifth NAND gates, the clock signal is supplied to said fourth and fifth NAND gates, the first data signal is supplied to said first AND gate, the second data signal is supplied to said second AND gate, the clear signal is supplied to said fourth NAND gate and said first and second AND gates, an output signal of said third NAND gate is supplied to said fourth NAND gate, an output signal of said fourth NAND gate is supplied to said third and fifth NAND gates, an output signal of said fifth NAND gate is supplied to said first and second AND gates, output signals of said first and second AND gates are supplied to said NOR gate, and an output signal of said NOR gate is supplied to said third and fifth NAND gates, respectively.

6. A semiconductor integrated circuit device as claimed in claim 1, wherein the preset signal is supplied to said first NAND gate, the clear signal is supplied to said second NAND gate, one output signal of the complementary output signals of said preceding circuit portion is supplied to said first NAND gate, the other output signal of the complementary output signals of said preceding circuit portion is supplied to said second NAND gate, an output signal of said first NAND gate is supplied to said second NAND gate, and an output signal of said second NAND gate is supplied to said first NAND gate.

7. A semiconductor integrated circuit device as claimed in claim 1, wherein said compensation circuit portion comprises seventh and eighth two-inputs NAND gates.

8. A semiconductor integrated circuit device as claimed in claim 7, wherein the complementary output signals of said preceding circuit portion include a first output signal and a second output signal, the first output signal of the complementary output signals of said preceding circuit portion is supplied to a first input terminal of said eighth NAND gate without passing through said flip-flop circuit portion, the second output signal of the complementary output signals of said preceding circuit portion is supplied to a first input terminal of said seventh NAND gate without passing through said flip-flop circuit portion, and wherein the complementary output signals of said flip-flop circuit portion include a first output signal and a second output signal, the first output signal of the complementary output signals of said flip-flop circuit portion is supplied to a second input terminal of said seventh NAND gate, and the second output signal of the complementary output signals of said flip-flop circuit portion is supplied to a second input terminal of said eighth NAND gate.

* * * * *

UNITED STATES PATENT AND TRADEMARK OFFICE
CERTIFICATE OF CORRECTION

PATENT NO. : 5,323,065
DATED : June 21, 1994
INVENTOR(S) : EBIHARA et al.

It is certified that error appears in the above-indentified patent and that said Letters Patent is hereby corrected as shown below:

Col. 1,    line 9, after "circuit" insert --device--.

Col. 2,    line 42, change "gate" to --gates--.

Col. 4,    line 28, change "different of load capacitance values" to --different values of load capacitance--.

Signed and Sealed this

Fifteenth Day of November, 1994

Attest:

BRUCE LEHMAN

Attesting Officer     Commissioner of Patents and Trademarks